United States Patent [19]

Francavilla et al.

[11] 4,279,969
[45] Jul. 21, 1981

[54] METHOD OF FORMING THIN NIOBIUM CARBONITRIDE SUPERCONDUCTING FILMS OF EXCEPTIONAL PURITY

[75] Inventors: Thomas L. Francavilla, Washington, D.C.; Stuart A. Wolf, Greenbelt, Md.

[73] Assignee: The United States of America as represented by the Secretary of the Navy, Washington, D.C.

[21] Appl. No.: 122,945

[22] Filed: Feb. 20, 1980

[51] Int. Cl.$^3$ ............................................ C23C 15/00
[52] U.S. Cl. ................................ 428/698; 204/192 S; 428/701
[58] Field of Search ..................... 204/192 S; 428/539, 428/690, 698, 701

[56] References Cited

U.S. PATENT DOCUMENTS 3,912,612  10/1975  Gavaler et al. ...................... 204/192

OTHER PUBLICATIONS

S. A. Wolf et al., ". . . Properties of Superconducting RF Reactively Sputtered NBN Films", *J. Vac. Sci. Technol.*, 17(1), Jan./Feb. 1980, pp. 411–414.

J. R. Gavaler, "Superconducting Properties of Niobium Carbonitride Thin Films", *Applied Physics Letters*, vol. 19, No. 8, (15 Oct. 1971), pp. 305–307.

M. A. Janocko, "Preparation and Properties of Superconducting Thin Films . . . ", *J. Vac. Sci. Technol.*, vol. 7, No. 1, (Jan./Feb. 1970), pp. 127–129.

*Primary Examiner*—Delbert E. Gantz
*Assistant Examiner*—William Leader
*Attorney, Agent, or Firm*—R. S. Sciascia; William T. Ellis; Daniel R. Zirker

[57] ABSTRACT

Thin superconducting NbCN films are deposited by reactive sputtering onto a dielectric substrate inside a vacuum chamber. The substrate is heated to a temperature of 600°–1200° C., ultra-pure Argon is introduced into the chamber, and niobium is presputtered from a high-purity target onto a shutter. A cyanogen and nitrogen gas mixture is introduced into the chamber at a rate of approximately $10^{-6}$ Torr liters/sec, and a shutter is opened exposing the substrate to the sputtered niobium. The deposited niobium reacts with the cyanogen-nitrogen gas mixture to form NbCN films of exceptional purity, and which exhibit superior superconductor properties.

8 Claims, 1 Drawing Figure

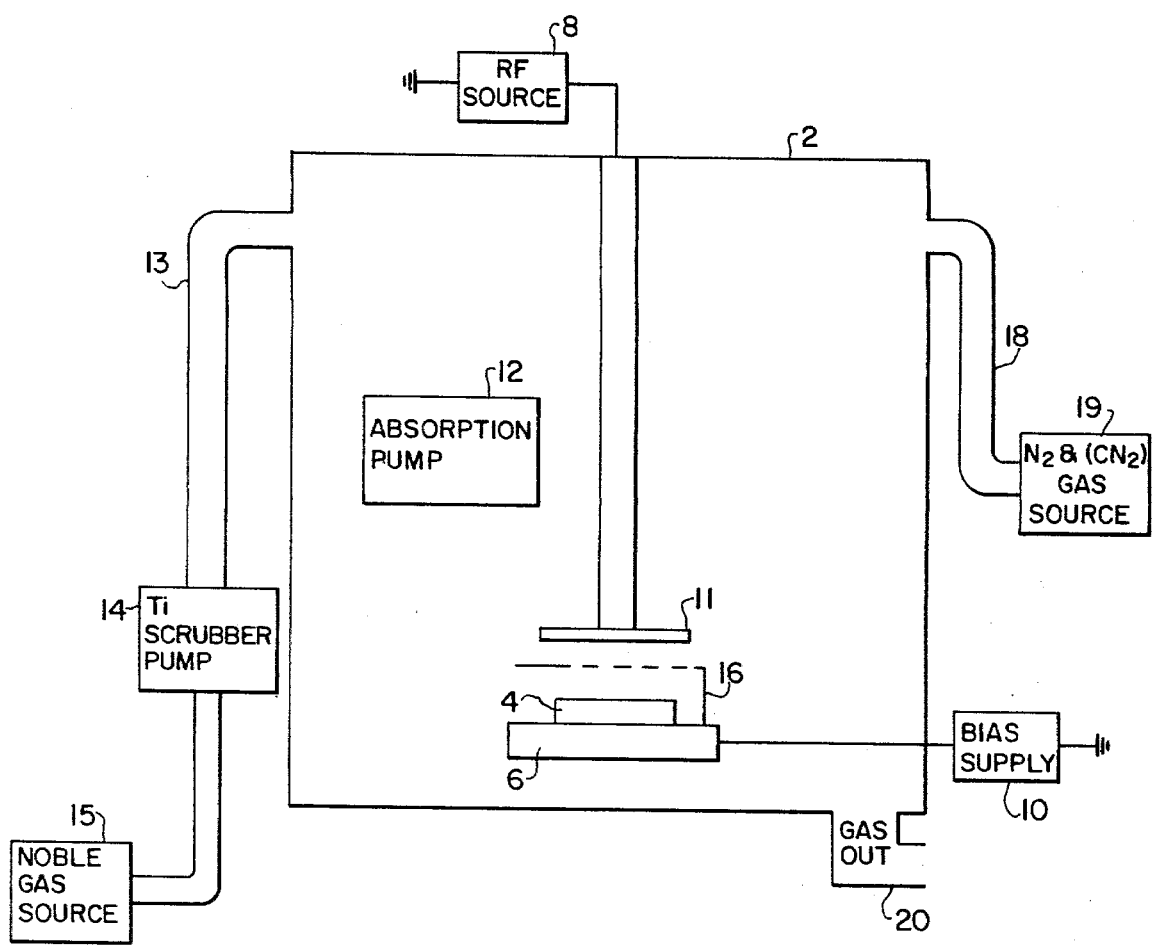

METHOD OF FORMING THIN NIOBIUM CARBONITRIDE SUPERCONDUCTING FILMS OF EXCEPTIONAL PURITY

BACKGROUND OF THE INVENTION

This invention relates to superconducting films, and a method for their production. More particularly, this invention relates to superconducting thin films of niobium carbonitride of high quality (i.e., high transition temperature $T_c$, high critical current $J_c$, low RF losses, etc).

Superconductors are electrical conducting elements capable of substaining large currents without electrical loss under cryogenic-temperature operating conditions. The precise amount of current that can be carried without loss is a complex function of the material's temperature, magnetic field, chemical composition, and metallurgical history.

Superconducting films have a wide variety of applications, some of which are: conductors for superconducting magnetic or power transmission lines; high Q, low loss cavities required for ultra-stable frequency standards; utlrasensitive magnetometry; and digital circuitry applications.

It is well known that certain metals, alloys and compounds go through a superconducting transition into a state in which electrical resistance virtually ceases to exist at temperatures approaching absolute zero. The temperature at which such a material enters this superconducting state is known as the transition temperature, $T_c$. As long as the temperature of the material remains below its particular $T_c$, a large current will flow, unless the magnetic field rises to a critical level, $H_c$. This critical field, $H_c$, is itself a function of temperature, increasing in value as the temperature dips below $T_c$ and approaches absolute zero.

It is desirable that $T_c$ be as high as possible, just as it is desirable that $H_c$ be high. The reasons for this are simple; a higher $T_c$ allows a much higher operating condition without disrupting performance, thus leading to reduced refrigeration costs together with higher performance. A higher $H_c$ allows more current to flow, as well as enabling larger magnetic fields to be used, thus leading to greater performance capabilities. In addition, the critical current density, $J_c$, which is the maxium density of current flowing through the material at a given operating temperature and magnetic field which will cause the superconductor to go from the superconducting to the normal state, is a function of $H_c$ and $T_c$. Much emphasis in the field of superconductivity has centered around finding materials that exhibit high $T_c$, $H_c$, and $J_c$.

The superconducting properties of niobium carbonitride are well known; films of NbCN exhibiting a critical temperature as high as 18° K. and a $H_c$ of more than 25 T have been made. Several techniques of preparing NbCN films are known; chemical vapor deposition, sintering pressed compacts of NbN and NbC powders, and most recently, reactive sputtering of niobium in a methane-argon vacuum atmosphere. However, these techniques have been unable to avoid the contamination with unwanted elements that lowers performance qualities. Thus, the development of a homogeneous, thin niobium carbonitride film of high purity presents a new and difficult problem.

The prior art has made several attempts at producing thin superconducting films with optimum properties. U.S. Pat. No. 3,912,612 Gavaler et al, uses a D.C. reactive sputtering techniques to produce thin superconducting films such as NbN. Hydrocarbon gases, such as methane, are added to the vacuum chamber, along with nitrogen and argon, and react with the sputtered niobium to produce NbN, and other films. Contamination from even the trace amounts of residue gases which are present, even in extremely high vacuums, presents a serious problem which can seriously damage the superconductive properties of the film. U.S. Pat. Nos. 3,951,870 and 3,912,461 both prepare NbCN films; the 3,951,870 patent produces the material in the form of continous fine diameter multifilament yarn instead of thin films, and the 3,912,461 patent is concerned with providing very hard, durable and abrasion resistant coatings. An article by Brunet et al, *High Field Critical Current Densities and Resistive Transition on NbCN Superconducting Films,* Vol. 19, No. 2, in the February 1979 "Cyrogenics", studied the influence of the carbon density on the critical current densities ($J_c$) of thin NbCN films in high magnetic fields. The influence of the carbon-nitrogen ratio on the high field properties, specifically $J_c$, was also investigated. However, no system has yet been able to optimize thin NbCN superconducting films by substantially avoiding the contamination exhibited by earlier films.

SUMMARY OF THE INVENTION

The present invention relates to a method for producing thin films of superconducting NbCN having superior properties. An RF reactive sputtering technique is employed wherein the components which ultimately form the thin film are assembled in a reaction chamber exposed to a constant flow of reactant gases, and a film is deposited on a suitable dielectric substrate. The chamber is evacuated to around $10^{-10}$ Torr, and the substrate heated to between 600° C. and 1200° C. An ultra pure inert gas, such as argon, is admitted to the reactor, and niobium is presputtered onto a shutter. A cyanogen and nitrogen mixture is introduced into the chamber at a constant rate of $10^{-6}$ Torr liters/sec; and the substrate is then exposed to the sputtered Nb while exposed to an RF power density. At some time during the deposition process, the niobium reacts with the cyanogen and nitrogen to form NbCN films of exceptional purity.

In is an object of this invention to prepare superconducting NbCN thin films having high transition temperatures, high critical current values, and high critical magnetic field values.

It is a further object of this invention to prepare superconducting NbCN thin films of exceptional purity and correspondingly exceptional properties.

It is a still further object of this invention to produce conductors for superconducting magnets, power transmission lines, microwave frequency generators and detectors, and ultrasensitive magnetometers.

It is another object of the invention to eliminate the usage of methane and other hydrocarbons in the reaction chamber so as to avoid contamination in the sputtered films.

Other objects, advantages and novel features of the invention wil become apparent from the following detailed description of the invention and from the accompanying drawings illustrative of the invention wherein;

FIG. 1 is a schematic diagram of the essential elements necessary for performing the process of the invention.

DETAILED DESCRIPTION OF THE INVENTION

In practicing the method of the invention, great care must be taken in designing the RF sputtering system used for the preparation of NbCN films.

In FIG. 1, a schematic version of an RF biasing sputtering chamber is seen, to which referral will be made hereinafter.

According to the present invention, the method is carried out by the following sequence of steps:

1. Place within the closed reactor chambers 2 a suitable substrate material 4 upon substrate holder 6 on which thin films can be sputtered under the conditions set forth hereinafter. Dielectric substrates, such as quartz and saphire, are definitely preferred. RF biasing can be provided by splitting the power of the RF power unit 8, and sending a small amount, generally less than 10%, to the bias supply unit 10. This aids in cleaning the sputtered film. It is important that substrate 4 the clamped down on support 6, so that the high temperatures necessary for the formation of high quality films can be achieved.

The target 11, which functions as the cathode, provides the niobium or other material which is to be later sputtered onto substrate 4 as a constituent of the thin film. The position of the target should be carefully checked in the chamber, relative to the substrate. The range of distances between the target 11 (cathode) and substrate 4 (anode) can vary anywhere from $\frac{1}{2}$ to 4 inches. The cathode should be of exceptional purity; requirements for such niobium are found in the article, "*Properties of Super-conducting rf sputtered ultra this films of Nb*", by Wolf et al, "*Journal of Vacuum Science Technology*", Vol. 13, No. 1, January/February 1976.

3. The chamber 2 is then evacuated by using a nitrogen cooled absorption pump, schematically represented as 12 in FIG. 1, and then first having the conventional turbo-molecular pumps reduce the reaction chamber pressure to about $10^{-5}$ to $10^{-6}$ Torr, during a 2–4 hour period while the substrate is heated to about 1000° C. during the evacuation. At this point an ion pump is substituted for the turbo pump, and pumping continues for a period of 10 to 15 hours until pressures of $10^{-9}$ Torr and less are obtained. The temperature of the chamber, meanwhile, is allowed to cool to room temperature after the initial substrate bake out period, during which many volatile environmental impurities were removed.

4. Upon reaching about $10^{-8}$ to $10^{-9}$ Torr, liquid nitrogen-cooled cryo panels take the reaction chamber to about $10^{-10}$ Torr, the preferred operating pressure.

5. Upon reaching this pressure, an inert gas, i.e., a gas which is non-reactive with all the components contained within the reactor, and which gas will support sputtering to provide the plasma necessary for the transfer of the niobium to the substrate is introduced into the reactor 2 from a source 15, through inert gas inlet 13. Any of the noble gases are suitable, with argon being preferred. The partial pressure of the argon within the reactor should be about 60 to 80 microns, i.e., $6-8 \times 10^{-2}$ Torr. To be sure the argon is ultra pure, before entering the reactor it is scrubbed by passing through a titanium scrubber 14, an auxiliary purification means that cleans the argon to better than 99.9995% purity.

6. Once a sufficient amount of inert gas has been introduced into the reactor to enable the initiation of sputtering, presputtering is initiated for 5–10 minutes at an RF power density of about 6 watts/cm², although different power densities are permitted. A rotatable shutter 16 (protective covering) is placed over substrate 4 during this period so as to protect it during this pre-cleaning period and to prevent deposition of anything but the desired film. The substrate heaters are turned on and allowed to reach the predetermined temperature.

7. Introduce into the reactor chamber a mixture of $N_2$ and $(CN)_2$ gases from a source 19 at a constant flow rate of about $10^{-6}$ Torr liters/sec through inlet 18. The composition of this two component stream can vary anywhere from 0–100% of either $(CN)_2$ or $N_2$ composition. It is important that this flow of reactant gases into the chamber be kept substantially constant.

8. Once a partial pressure of about 5 microns, i.e., $5 \times 10^{-3}$ Torr of reactant gas is obtained in the reactor, shutter 16 is removed, and sputtering is initiated for periods of anywhere from 2–50 minutes at a preferred power density of about 15 watts/cm². Thin films of NbCN varying in thickness from 200–6000 A° are produced, with films of about 1000 A° being generally perferred for superconductor applications, although the desired thickness can vary greatly, depending upon the application. Sputtering times of 10–15 minutes are preferred for the 1000 A° films.

9. Once the desired film thickness has been deposited, the chamber is pumped out of reactant gas through outlet 20, and cooled to room temperature in 10–15 hours, at which time the substrate is removed.

Although applicants do not wish to be bound by theory, the improved qualities of the NbCN films, leading to higher $T_c$, are believed to occur for the following reasons:

A. The employment of a dielectric substrate capable of retaining a bias during the process enables an extra degree of impurities to be removed from the substrate.

B. The addition of a substrate shutter to the chamber apparatus protects the substrate, both from contaminants in the reactor chambers and other extraneous contamination, until the initiation of film deposition.

C. The introduction of ultra pure cyanogen gas, $(CN)_2$, into the reaction chamber is important. Usage of other hydrocarbons, such as methane, $CH_4$, in sputtering reactions as where niobium has been sputtered in a residual atmosphere also containing argon, or argon and nitrogen, has resulted in impurities being transmitted to the sputtered film, even under the purest of environmental conditions. It is hypothesized that contamination from the hydrogen residue of the reacted methane, or whatever hydrocarbon is used as a source of carbon and/or nitrogen in the reactive sputtering reaction, is responsible for impurities entering the sputtered film, and hence, lowering of the film's superconducting qualities.

D. A substantial improvement in the process is believed to be the constant flow of reactant $N_2 + (CN)_2$ gases into the reactor. This allows a substantially constant reactant gas volume to exist in the reactor, whereas the prior art methods created changing composition gradients during the reaction, thus leading to a non-homogeneous films deposited during the course of the reaction. It is believed, for example, that the NbCN films produced by the method of U.S. Pat. No. 3,912,612 are not pure, stoichiometric, NbCN films, but rather NbN films frequented with interstitial carbide elements.

E. The usage of a titanium sublimation pump, which can be placed inside, as well as outside, the reactor chamber, has further aided in producing ultra pure reactant gases.

F. The usage of RF sputtering techniques avoids the reactions that sometimes occur on the target surface during D.C. reactive sputtering, and which can leave an insulating layer on the target surface. In RF sputtering, the insulating layer is sputtered away as soon as it forms. Also, the combination of RF sputtering to clean substrate surfaces and RF induced substrate bias during deposition is believed to improve the quality of sputtered metal films, especially very thin films, since the bias voltage can be applied from the onset of deposition.

G. At the highest substrate temperatures, e.g. 1100° C. and greater, films deposited upon saphire substrates have been found to be free of the "crazing" usually observed in films deposited upon quartz substrates at these temperatures. This compatibility of NbCN films and saphire substrates under these condition is believed to result from a lesser mechanical strain being imposed on the films, with a corresponding improvement in the superconducting properties of the resultant product.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A method for the preparation of superconducting thin films of niobium carbonitride of exceptional purity, comprising:

assembling within a closed reactor a dielectric substrate and a pure niobium target;

evacuating the reactor to a pressure of about $10^{-10}$ Torr, while heating the components contained within the reactor so as to substantially eliminate all volatile impurities therefrom;

admitting an inert gas into the reactor until the inert gas attains a pressure within the range of about 6 to $8 \times 10^{-2}$ Torr;

heating the dielectric substrate to a temperature of 600° C. to 1200° C.;

initiating presputtering while protecting the substrate from any deposition with a protective cover;

admitting cyanogen gas or a nitrogen-cyanogen gas mixture at a substantially constant volumetric flow rate of about $10^{-6}$ Torr liters/sec into the reactor, wherein the cyanogen gas is admitted into the reactor at a constant flow rate which ranges from $10^{-9}$ to $10^{-6}$ Torr liters/sec;

removing the protective-covering of the dielectric substrate after a partial pressure of about 5 microns of reactant gas is obtained in the reactor;

applying a constant RF power density of about 10–20 watts/cm$^2$ to the niobium target in order to initiate reactive sputtering;

forming a thin NbCN film of a desired thickness;

cooling the reactor and the deposited film back to room temperature and pressure.

2. The method of claim 1, in which the inert gas is ultrapure argon.

3. The method of claim 1, in which the dielectric substrate is sapphire.

4. The method of claim 1, in which the substrate is preheated to a temperature of about 1000° C. for a period of about 2 to 4 hours.

5. The method of claim 1, in which the preferred RF power density during presputtering is about 6 watts/cm$^2$.

6. The method of claim 1 where the preferred RF power density during reactive sputtering is about 15 watts/cm$^2$.

7. The method of claim 1 whereby the NbCN film deposited is of a thickness from about 200 to about 6000 A2°.

8. The thin superconducting film on a dielectric substrate produced by the process of claim 1.

* * * * *